United States Patent
Abdo

(10) Patent No.: US 10,164,724 B2
(45) Date of Patent: Dec. 25, 2018

(54) MICROWAVE COMBINER AND DISTRIBUTER FOR QUANTUM SIGNALS USING FREQUENCY-DIVISION MULTIPLEXING

(71) Applicant: INTERNATIONAL BUSINESS MACHINES CORPORATION, Armonk, NY (US)

(72) Inventor: Baleegh Abdo, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/275,511

(22) Filed: Sep. 26, 2016

(65) Prior Publication Data
US 2018/0091244 A1    Mar. 29, 2018

(51) Int. Cl.
*H04J 1/08* (2006.01)
*H01P 1/213* (2006.01)
*H03H 7/46* (2006.01)
*H01P 5/12* (2006.01)

(52) U.S. Cl.
CPC .............. *H04J 1/08* (2013.01); *H01P 1/213* (2013.01); *H01P 5/12* (2013.01); *H03H 7/46* (2013.01)

(58) Field of Classification Search
CPC .............. H04J 1/08; H01P 1/213; H03H 7/46
USPC ........................................... 333/99 S
See application file for complete search history.

(56) References Cited

U.S. PATENT DOCUMENTS

| | | | | | |
|---|---|---|---|---|---|
| 5,689,219 | A | * | 11/1997 | Piirainen | H01P 1/213 333/127 |
| 5,703,020 | A | * | 12/1997 | Das | H01P 1/181 333/161 |
| 7,030,714 | B2 | * | 4/2006 | Korol | H03F 1/0294 333/124 |
| 7,218,184 | B2 | * | 5/2007 | Yamanaka | H01P 1/20336 333/204 |
| 7,245,196 | B1 | * | 7/2007 | Baliarda | H01P 1/20381 333/219 |

(Continued)

FOREIGN PATENT DOCUMENTS

CN    2924805 Y    7/2007
CN    204103013 U    1/2015

(Continued)

OTHER PUBLICATIONS

Hirayama et al., "Microwave SQUID Multiplexer for TES Readout," IEEE Transactions on Applied Superconductivity, vol. 23, Issue: 3 Article #: 2500405, DOI: 10.1109/TASC.2012.2237474, Jun. 2013, pp. 1-5.

(Continued)

*Primary Examiner* — Dean Takaoka
*Assistant Examiner* — Alan Wong
(74) *Attorney, Agent, or Firm* — Cantor Colburn LLP; Vazken Alexanian

(57) ABSTRACT

A technique relates to a superconducting microwave combiner. A first filter through a last filter connects to a first input through a last input, respectively. The first filter through the last filter each has a first passband through a last passband, respectively, such that the first passband through the last passband are each different. A common output is connected to the first input through the last input via the first filter through the last filter.

23 Claims, 7 Drawing Sheets

(56) References Cited

U.S. PATENT DOCUMENTS

| | | | |
|---|---|---|---|
| 7,327,996 B2 * | 2/2008 | Chen | H04B 1/18 455/300 |
| 7,676,252 B2 * | 3/2010 | Kayano | H01P 1/203 333/202 |
| 7,706,536 B2 | 4/2010 | Dinu et al. | |
| 7,755,452 B2 * | 7/2010 | Knickerbocker | H01P 5/16 330/124 R |
| 7,876,145 B2 | 1/2011 | Koch | |
| 8,188,752 B2 | 5/2012 | Ketchen et al. | |
| 8,395,460 B2 * | 3/2013 | Khan | H01P 5/12 333/127 |
| 8,854,074 B2 | 10/2014 | Berkley | |
| 9,306,511 B2 * | 4/2016 | Chow | H03F 3/193 |
| 9,735,776 B1 | 8/2017 | Abdo et al. | |
| 2002/0130716 A1 | 9/2002 | Larson et al. | |
| 2002/0151331 A1 * | 10/2002 | Abdelmonem | H04B 1/18 455/561 |
| 2008/0310480 A1 | 12/2008 | Maiuzzo | |
| 2013/0015924 A1 * | 1/2013 | Andre | H01L 23/642 333/32 |
| 2015/0084713 A1 * | 3/2015 | Maxim | H03H 7/0161 333/17.1 |
| 2016/0044647 A1 | 2/2016 | Ashrafi et al. | |

FOREIGN PATENT DOCUMENTS

| | | |
|---|---|---|
| WO | 2007141353 A1 | 12/2007 |
| WO | 2015178992 A2 | 11/2015 |

OTHER PUBLICATIONS

Baleegh Abdo et al,"Scalable Qubit Drive and Readout", Related Application, U.S. Appl. No. 15/492,812, filed Apr. 20, 2017.

Baleegh Abdo, "Reducing the Number of Input Lines to Superconducting Quantum Processors Installed Inside Dilution Refrigerators", Related Application, U.S. Appl. No. 15/782,544, filed Oct. 12, 2017.

PCT/IB2017/055316 International Search Report and Written Opinion, dated Nov. 30, 2017.

* cited by examiner

MICROWAVE COMBINER AND DISTRIBUTER FOR QUANTUM SIGNALS USING FREQUENCY-DIVISION MULTIPLEXING

BACKGROUND

The present invention relates to superconducting electronic devices, and more specifically, a microwave combiner and distributer for quantum signals using frequency-division multiplexing.

In telecommunications, frequency-division multiplexing is a technique by which the total bandwidth available in a communication medium is divided into a series of non-overlapping frequency sub-bands, each of which is used to carry a separate signal. This allows a single transmission medium such as the airways, a cable, or an optical fiber to be shared by multiple independent signals.

In physics and computer science, quantum information is information that is held in the state of a quantum system. Quantum information is the basic entity of study in quantum information theory, and can be manipulated using engineering techniques known as quantum information processing. Much like classical information can be processed with digital computers, transmitted from place to place, manipulated with algorithms, and analyzed with the mathematics of computer science, analogous concepts apply to quantum information. Quantum systems such as superconducting qubits are very sensitive to electromagnetic noise, particularly in the microwave and infrared domains.

SUMMARY

According to one or more embodiments, a superconducting microwave combiner is provided. The superconducting microwave combiner includes a first filter through a last filter. The first filter through the last filter connects to a first input through a last input, respectively. The first filter through the last filter each has a first passband through a last passband, respectively, such that the first passband through the last passband are each different. Also, the superconducting microwave combiner includes a common output connected to the first input through the last input via the first filter through the last filter.

According to one or more embodiments, a method of configuring a superconducting microwave combiner is provided. The method includes providing a first filter through a last filter, where the first filter through the last filter connects to a first input through a last input, respectively. The first filter through the last filter each has a first passband through a last passband, respectively, such that the first passband through the last passband are each different. Also, the method includes providing a common output connected to the first input through the last input via the first filter through the last filter.

According to one or more embodiments, a superconducting microwave distributer is provided. The superconducting microwave distributer includes a first filter through a last filter, where the first filter through the last filter connects to a first output through a last output, respectively. The first filter through the last filter has a first passband through a last passband, respectively, such that the first passband through the last passband are each different. Also, the superconducting microwave distributer includes a common input connected to the first output through the last output via the first filter through the last filter.

According to one or more embodiments, a method of configuring a superconducting microwave distributer is provided. The method includes providing a first filter through a last filter, where the first filter through the last filter connect to a first output through a last output, respectively, wherein the first filter through the last filter has a first passband through a last passband, respectively, such that the first passband through the last passband are each different. The method includes providing a common input connected to the first output through the last output via the first filter through the last filter.

According to one or more embodiments, a superconducting system is provided. The superconducting system includes a first quantum system through a last quantum system, and a first filter through a last filter. The first filter through the last filter connects to the first quantum system through the last quantum system, respectively. The first filter through the last filter has a first passband through a last passband, respectively, such that the first passband through the last passband are each different. The superconducting system includes a common output connected to the first quantum system through the last quantum system via the first filter through the last filter.

DETAILED DESCRIPTION

Figure 1:
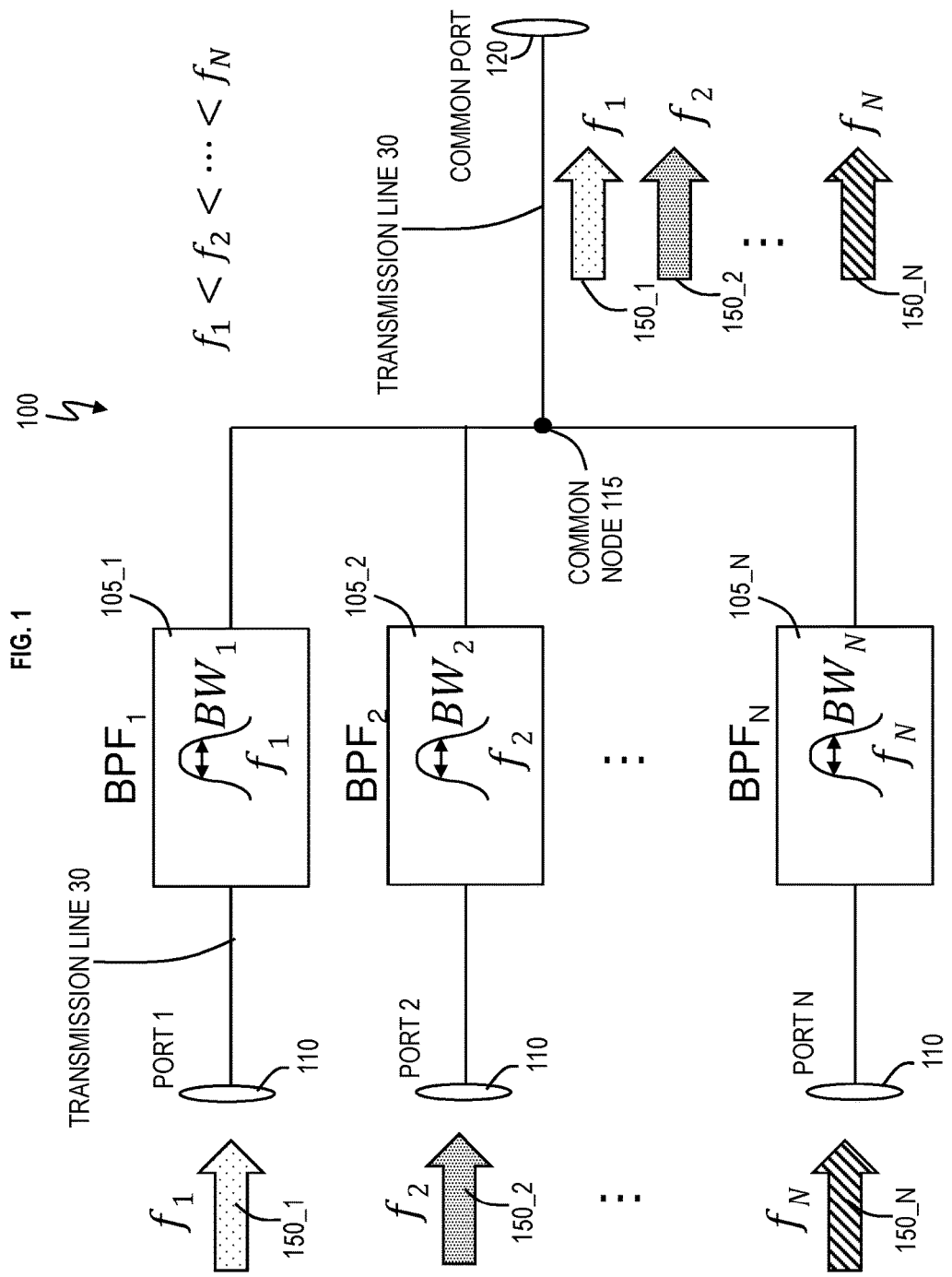
FIG. 1 is a schematic of a device depicting a microwave combiner for quantum signals according to one or more embodiments.

Various embodiments are described herein with reference to the related drawings. Alternative embodiments can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Employing microwave power combiners in order to combine quantum signals in the microwave domain comes at the expense of impedance mismatches between the ports (which causes reflections), poor isolation between (certain) ports, and/or loss of quantum information due to attenuation of the quantum signal. The loss of quantum information can be either due to internal loss of the power combiner or leakage to other ports. This loss of quantum information can result in a significant decrease in the signal-to-noise ratio of the measurement.

Furthermore, in a scalable quantum processor architecture based on superconducting qubits, it is important to minimize the number of input and output lines that go into a dilution fridge. One way to achieve this on the output side is, for example, by combining multiple readout signals of multiple qubits on the same output line using hybrids or commercial power combiners. Subsequently, a broadband quantum-limited amplifier can be utilized to amplify the multiple readout signals before they propagate up the output chain. However, using such hybrids or power combiners attenuate the quantum signals before the amplifier and result in significant loss of quantum information, thus limiting the efficiency of the quantum measurement.

Another possibility is to add the power combiners following multiple quantum-limited amplifiers which amplify each individual signal. However, the downside of this scheme is the addition of bulky hardware (multiple amplifiers) to the dilution fridge which limits scalability of such as scheme. A dilution refrigerator is a cryogenic device that provides continuous cooling to temperatures as low as 7 millikelvin (mK), with no moving parts in the low-temperature region.

Below are a few examples of power combiners or dividers.

The following are characteristics of a T-Junction power combiner: 1) 3-port device with one input port and two output ports, 2) lossless, 3) reciprocal, 4) no isolation between the output ports, and 5) matched only to the input.

Characteristics of a resistive divider include the following: 1) 3-port device, 2) reciprocal, 3) can be matched at all ports (no reflection), 4) lossy, and 5) no isolation between the output ports.

Characteristics of hybrids (90° and 180° hybrids) include the following: 1) 4-port devices with two input ports and two output ports, 2) reciprocal, 3) can be matched at all ports (no reflection), 4) good isolation between the two input ports, and between the two output ports. If the hybrids are used as a power combiner, the power is divided equally between the two output ports such that half of the information is lost.

The following are characteristics of a Wilkinson power divider/combiner: 1) 3-port device with one input and two output ports (can be generalized to N-way device), 2) matched at all ports (no reflection), 3) isolation between the two output ports, 4) lossy when combining signals that are input on the output ports, because only half of the signal power shows up at the input, while the other half is dissipated.

One or more embodiments address problems or issues related to multiplexing the drive and readout of multiple qubit-resonator systems using a small number of input and output lines (thereby providing scalability), without causing loss of quantum information (lossless), and without allowing leakage of signals between different qubit-resonator systems (isolation between input ports and/or isolation between output ports). Embodiments include one or more methods and devices that separate the microwave signals (drive signals and readout signals) based on their frequency, thus allowing the methods and devices to multiplex the readout and drive of multiple qubits without attenuating the microwave signals used in the drive/readout. Also, the devices are provided with isolation between the different ports.

According to one or more embodiments, the device can be a multiport on-chip superconducting microwave combiner and/or distributer for quantum signals. The microwave combiner and distributer are lossless and their ports are matched to the input/output environment. The superconducting microwave combiner and/or distributer can be used in scalable quantum processing architectures, such as for qubit drive and readout.

In one or more embodiments, a microwave combiner and distributer are configured in the same device. The direction of the input signals determines if the device is operating as a microwave combiner or distributer.

FIG. 1 is a schematic of a device depicting a microwave combiner for quantum signals according to one or more embodiments. The device 100 is configured to utilize frequency-division multiplexing to allocate different frequencies for different microwave signals onto a single output transmission line.

The device 100 includes bandpass microwave filters generally referred to as bandpass filters 105. The different bandpass filters 105 are depicted as bandpass filters 105_1 through bandpass filters 105_N. Each bandpass filter 105 has a different narrow passband through which microwave signals having a frequency in the particular narrow passband are transmitted (i.e., passed) and signals having a frequency outside of the particular narrow passband are reflected (i.e., blocked). The bandpass filter 105_1 has its own narrow passband with a bandwidth 1 ($BW_1$), bandpass filter 105_2 has its own narrow passband with a bandwidth 2 ($BW_2$), and bandpass filter 105_N has its own narrow passband with a bandwidth N ($BW_N$).

For example, bandpass filter 105_1 is configured with a passband (frequency band) that permits a microwave signal 150_1 having frequency $f_1$ to pass (transmit) through but blocks (reflects) all other microwave signals 150_2 through 150_N having frequencies $f_2$ through $f_N$ which are outside of the passband for bandpass filter 105_1. Similarly, bandpass filter 105_2 is configured with a passband (frequency band) that permits a microwave signal 150_2 having frequency $f_2$ to pass (transmit) through but blocks (reflects) all other microwave signals 150_1, 150_3 through 150_N having frequencies $f_1$, $f_3$ through $f_N$ which are outside of the passband for bandpass filter 105_2. Analogously, bandpass filter 105_N is configured with a passband (frequency band) that permits a microwave signal 150_N having frequency $f_N$ to pass (transmit) through but blocks (reflects) all other microwave signals 150_1 through 150_N−1 having frequencies $f_1$ through $f_{N-1}$ which are outside of the passband for bandpass filter 105_N. The microwave signals 150_1 through 150_N are generally referred to as microwave signals 150. When cavity-qubit quantum systems are operatively connected to the device 100, the microwave signals 150 can be at respective frequencies $f_1$ through $f_N$ designated to drive particular qubits or designated to readout qubit (via readout resonators or cavities), as understood by one skilled in the art.

As an example, one bandpass filter 105 can have a passband of 1 MHz, another bandpass filter 105 can have a passband of 10 MHz, yet another bandpass filter 105 can have a passband of 100 MHz, and so forth.

The device 100 includes ports 110 individually connected to respective bandpass filters 105. Particularly, the different ports 110 are designated as port 1, port 2 through port N, where port N represents the last of the ports 110. Similarly, N represents the last of the frequencies, microwave signals 150, bandpass filters 105, quantum systems 305 (discussed in FIG. 3), and so forth. In the device 100, port 1 is connected to bandpass filter 105_1, port 2 is connected to bandpass filter 105_2, and port N is connected to bandpass filter 105_N. Each port_1 through port_N is connected to one end of its own bandpass filter 105_1 through bandpass filter 105_N. The other end of the bandpass filter 105_1 through bandpass filter 105_N is connected to a common port 120 via a common node 115. The common node 115 can be a common connection point, a common transmission line, a common wire, etc., as a mutual location for electrical connection. The common port 120 connects to each bandpass filter 105_1 through bandpass filter 105_N, while the individual ports 110 (ports 1-N) are connected (only) to their respective bandpass filter 105_1 through bandpass filter 105_N.

Because the bandpass filters 105_1 through 105_N only transmit respective microwave signals 150_1 through 150_N in the respective passband, the device 100 is configured such that each bandpass filter 105_1 through bandpass filter 105_N covers a different band (or sub-band) of frequencies, such that none of the passbands (of the bandpass filters 105) are overlapping. Accordingly, each port 1, port 2, through port N is isolated from one another because of being connected to its respective bandpass filter 105_1 through 105_N, such that no microwave signal 150 through any one port 110 (whether entering or exiting) leaks into another port 110 via the common node 115. As such each port 110 is isolated from other ports 110 and is designed to transmit its own microwave signal 150 at a predefined frequency (or within a predefined frequency band), as a result of being connected to its own bandpass filter 105. As such, the bandpass filters 105_1 through 105_N are responsible for providing the isolation among ports 110 (e.g., port 1, port 2 through port N)

The respective ports 110, bandpass filters 105, common node 115, and common port 120 are connected to one another via transmission lines 30. The transmission line 30 can be a stripline, microstrip, etc. The microwave bandpass filters 105 are designed and implemented using lossless or low loss lumped elements such as superconducting inductors, superconducting gap capacitors and/or plate capacitors, and passive superconducting elements. The superconducting elements include lumped-element inductors, gap capacitors, and/or plate capacitors (with low loss dielectrics). Other possible implementations of the bandpass filters include coupled-line filters, and/or capacitively-coupled series resonators.

The respective ports 110, bandpass filters 105, common node 115, common port 120, and transmission lines 30 are made of superconducting materials. Examples of superconducting materials (at low temperatures, such as about 10-100 millikelvin (mK), or about 4 K) include niobium, aluminum, tantalum, etc.

In one implementation of the device 100 as a microwave combiner, a coaxial cable can connect to the external ends of the ports 110 and 120 such that coaxial cables connected to ports 110 input microwave signals 150_1 through 150_N at different frequencies $f_1$ through $f_N$ while another coaxial cable connected to common port 120 outputs the combined microwave signals 150_1 through 150N. In the microwave combiner, for each microwave signal 150_1 through 150N at its respective frequency $f_1$ through $f_N$, none of the microwave signals 150 are transmitted back through any of the other (input) ports 110 (i.e., port isolation), but instead each microwave signal 150_1 through 150_N passes through its respective bandpass filter 105_1 through 105_N, passes through the common node 115, and exits through the common port 120. As such, the microwave combiner combines the microwave signals 150_1 through 150_N and outputs them through the common port 120. The device 100 is configured with the frequency relation $f_1<f_2<\ldots<f_N$, where each frequency $f_1, f_2, \ldots f_N$ is the center frequency of the bandpass filters 105_1 through 105_N, respectively. The device 100 is configured such that it satisfies the inequality $$\frac{BW_j + BW_i}{2} < |f_j - f_i|$$

where i, j=1, 2, ... N and j≠i. This inequality requires that the frequency spacing between the center frequencies of each pair of bandpass filters exceeds their average bandwidths. In other words, the inequality ensures that none of the bandpass filters have overlapping bandwidths (i.e., frequency range).

Each port 1 through port N with its respective transmission line 30 (and respective bandpass filter 105_1 through 105_N) is considered a different/separate channel/input, and common port 120 is a common channel. Accordingly, when operating as a power combiner, multiple input channels of ports 1 through N are connected to the (single) common channel of common port 120. The device 100 is configured to be bidirectional. As noted herein, the same device 100 can be utilized as a both a microwave power combiner and microwave signal distributer.

Figure 2:
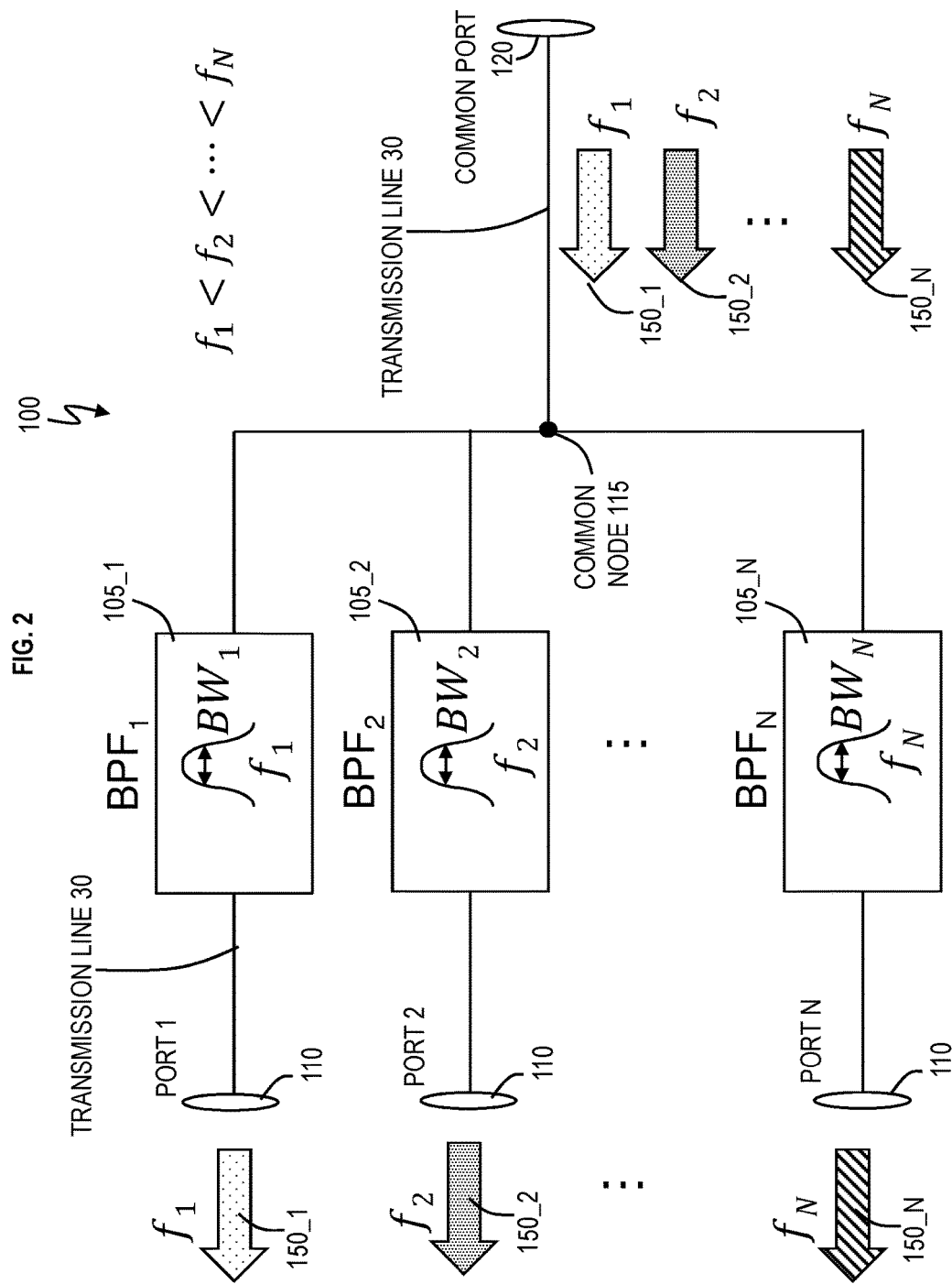
FIG. 2 is a schematic of the device depicting a microwave distributer for quantum signals according to one or more embodiments.

FIG. 2 is a schematic of the device 100 depicting a microwave distributer for quantum signals according to one or more embodiments. The microwave distributer device 100 is configured to distribute the microwave signals 150_1 through 150_N input on the common port 120 to individual ports 1 through N, in which the microwave signals 150_1 through 150_N are directed/distributed according to the passband of the respective bandpass filter 105_1 through 105_N.

In one implementation of the device 100 as the microwave distributer, a coaxial cable can connect to the external ends of the common port 120 such that the coaxial cable connected to the common port 120 inputs the microwave signals 150_1 through 150_N at different frequencies $f_1$ through $f_N$ while other coaxial cables connected to output ports 110 output the individual microwave signals 150_1 through 150N. In the microwave distributer, for each microwave signal 150_1 through 150N at its respective frequency $f_1$ through $f_N$, only individual frequencies $f_1$ through $f_N$ are permitted to pass through the respective bandpass filters 105_1 through 105_N having a passband covering the corresponding frequency $f_1$ through $f_N$, thus passing through individual port 1 through port N. Because each of the bandpass filters 105_1 through 105_N has no overlapping passband, each microwave signal 150_1 through 150_N has its own frequency $f_1$ through $f_N$ predefined to only pass through one of the bandpass filters 105_1 through 105_N. The microwave signals 150 at its own one of the frequencies $f_1$ through $f_N$ are input through the common port 120, and each microwave signal 150_1 through 150_N passes through the common node 115, is transmitted through its respective bandpass filter 105_1 through 105_N, and exits through individual ports 1-N according to frequency $f_1$ through $f_N$. Each port 1-N (only) outputs its own respective frequency $f_1$ through $f_N$ because of the filtering by the respective bandpass filters 105_1 through 105_N. In other words, port 1 outputs microwave signal 150_1 at frequency $f_1$ (via bandpass filter 105_1), while bandpass filter 105_1 blocks frequencies $f_2$-$f_N$. Port 2 outputs microwave signal 150_2 at frequency $f_2$ (via bandpass filter 105_2), while bandpass filter 105_2 blocks frequencies $f_1$, $f_3$-$f_N$. Similarly, port N outputs microwave signal 150_N at frequency $f_N$ (via bandpass filter 105_N), while bandpass filter 105_N blocks frequencies $f_1$-$f_{N-1}$.

In FIG. 2, each port 1 through port N with its respective transmission line 30 (and respective bandpass filter 105_1 through 105_N) is considered a different/separate channel/output, and common port 120 is a common channel/input. Accordingly, when operating as a power distributer, multiple output channels of ports 1 through N are connected to the (single) common (input) channel of common port 120.

As can be recognized in FIGS. 1 and 2, the device 100 is configured to be operated as both a microwave signal distributer and combiner according to whether the ports 110 or 120 receive input of the microwave signals 150.

Figure 3:
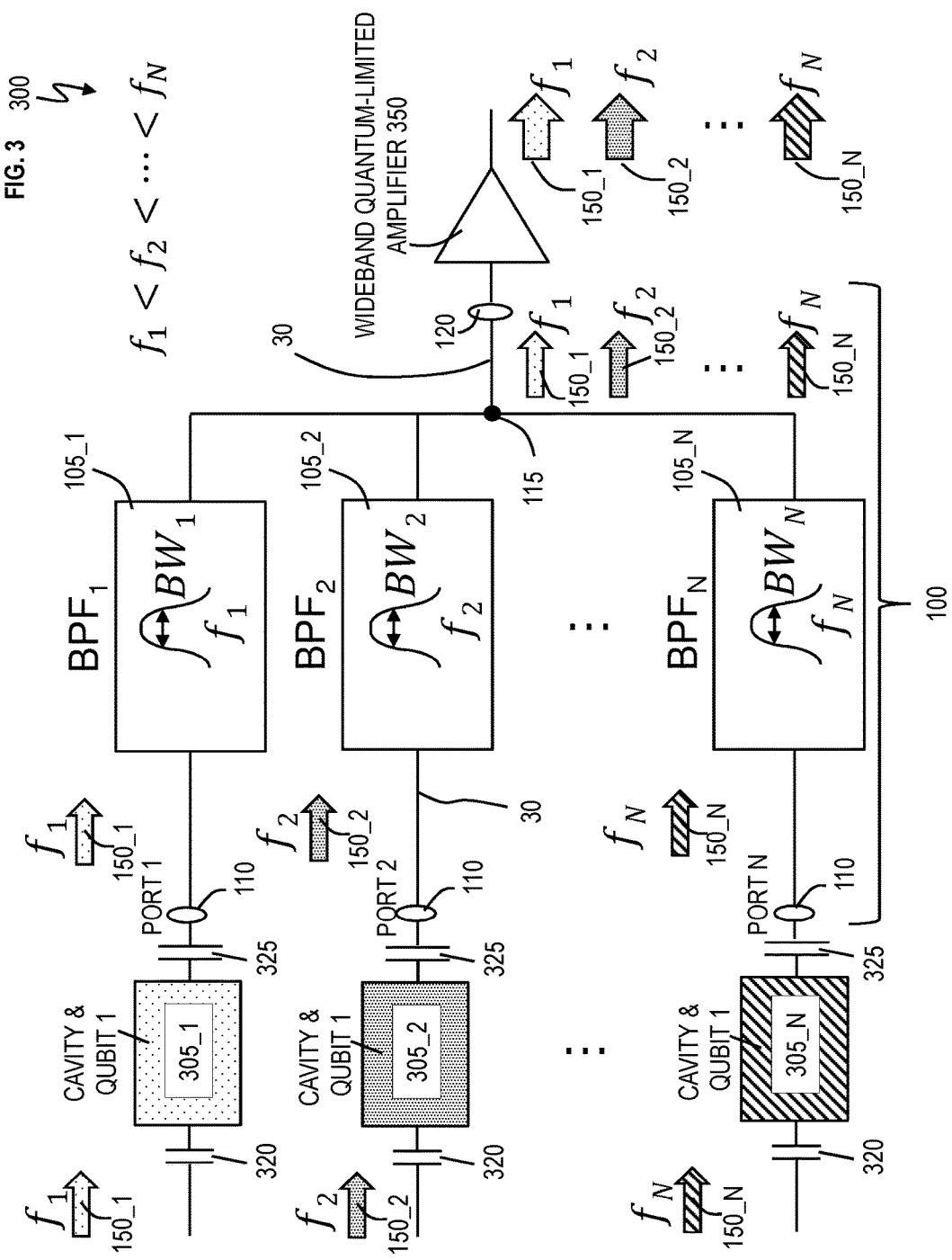
FIG. 3 is a system depicting the device utilized in a quantum system application according to one or more embodiments.

FIG. 3 is a system 300 depicting the device 100 utilized in a quantum system application according to one or more embodiments. FIG. 3 is an example application of the device 100 depicting frequency-multiplexed readout of qubits by having the microwave signals 150_1 through 150_N with frequencies $f_1$-$f_N$ that match or nearly match the respective resonance frequencies of the cavities/resonators 1-N. It should be appreciated that the example can be equally applied to drive the qubit by instead having the microwave signals 150_1 through 150_N with frequencies $f_1$-$f_N$ that match or nearly match the respective resonance frequencies of the qubits 1-N.

In the system 300, quantum systems 305_1 through 305_N are respectively connected to the (input) ports 1 through port N. The quantum systems can be generally referred to as quantum systems 305. The quantum system 305_1 can be a cavity and qubit 1 operatively coupled together. The quantum system 305_2 can be a cavity and qubit 2 operatively coupled together. Similarly, the quantum system 305_N can be a cavity and qubit N operatively coupled together. In the quantum system 305, the cavity and qubit can be capacitively connected, can be connected in a two-dimensional cavity, and/or can be connected in a three-dimensional cavity as understood by one skilled in the art. One type of qubit is a superconducting qubit containing at least one Josephson junction, where a Josephson junction is a nonlinear non-dissipative inductor formed of two superconducting metals (e.g., aluminum, niobium, etc.) sandwiching a thin insulator such as, for example, aluminum oxide, niobium oxide, etc.

In one implementation, the system 300 can also include a wideband quantum-limited amplifier 350 connected to the (output) common port 120. The wideband quantum-limited amplifier 350 has a wide bandwidth designed to amplify all the microwave signals 150 having respective frequencies $f_1$ through $f_N$.

Each quantum system 305 is designed to resonate at its own resonance frequency which is different for each quantum system 305. One skilled in the art recognizes that the cavity in each quantum system 305 is or operates as a resonator, such that the cavity resonates at its own resonance frequency, typically called a readout resonator frequency. Particularly, the cavity in the quantum system 305_1 is configured to resonate at its resonance frequency, for example, which is frequency $f_1$. The cavity in the quantum system 305_2 is configured to resonate at its resonance frequency which is frequency $f_2$. Similarly, the cavity in the quantum system 305_N is configured to resonate at its resonance frequency which is frequency $f_N$.

The quantum systems 305 are coupled to the device 100 via capacitors 325, and the quantum systems 305 are coupled to the external environment via capacitors 320. The external environment can include microwave signal generation equipment.

During frequency-multiplexed readout of the respective qubit in the quantum system 305_1 in the system 300, the microwave signal 150_1 at frequency $f_1$ is at the resonance frequency for the cavity in the quantum system 305_1, and the microwave signal 150_1 is at the frequency $f_1$ to target the both port 1 and the bandpass filter 105_1 (because the bandpass filter 105_1 is designed to pass frequency $f_1$). During frequency-multiplexed readout of the respective qubit in the quantum system 305_2, the microwave signal 150_2 at frequency $f_2$ is at the resonance frequency for the cavity in the quantum system 305_2, and the microwave signal 150_2 is at the frequency $f_2$ to target the both port 2 and the bandpass filter 105_2 (because the bandpass filter 105_2 is designed to pass frequency $f_2$). During frequency-multiplexed readout of the respective qubit in the quantum system 305_N, the microwave signal 150_N at frequency $f_N$ is at the resonance frequency for the cavity in the quantum system 305_N, and the microwave signal 150_N is at the frequency $f_N$ to target the both port N and the bandpass filter 105_N (because the bandpass filter 105_N is designed to pass frequency $f_N$). The microwave signals 150_1 through 150_N at the respective resonance frequencies $f_1$ through $f_N$ cause the quantum systems 305_1 through 305_N to respectively resonate, and therefore, the microwave signals 150 (at the respective resonance frequencies) cause the readout of the respective qubits coupled to their respective cavity (resonator). As such, the microwave signal 150_1 after interacting with the quantum system 305_1 (i.e., the qubit-resonator) is transmitted through port 1, to the bandpass filter 105_1, through the common port 120, and to the wideband quantum-limited amplifier 350. The microwave signal 150_2 after interacting with the quantum system 305_2 (i.e., the qubit-resonator) is transmitted through port 2, to the bandpass filter 105_2, through the common port 120, and to the wideband quantum-limited amplifier 350. Similarly, the microwave signal 150_N after interacting with the quantum system 305_N (i.e., the qubit-resonator) is transmitted through port N, to the bandpass filter 105_N, through the common port 120, and to the wideband quantum-limited amplifier 350. After interacting with the respective quantum system 305_1 through 305_N, each of the microwave signals 150_1 through 150_N contains quantum information (e.g., the state) of the respective qubits. Each of the microwave signals 150_1 through 150_N are (simultaneously) amplified by the wideband quantum-limited amplifier 350.

The quantum signal is a microwave signal. It should be recognized that the microwave signal 150 can be bi-directionally transmitted in the device 100.

Figure 4:
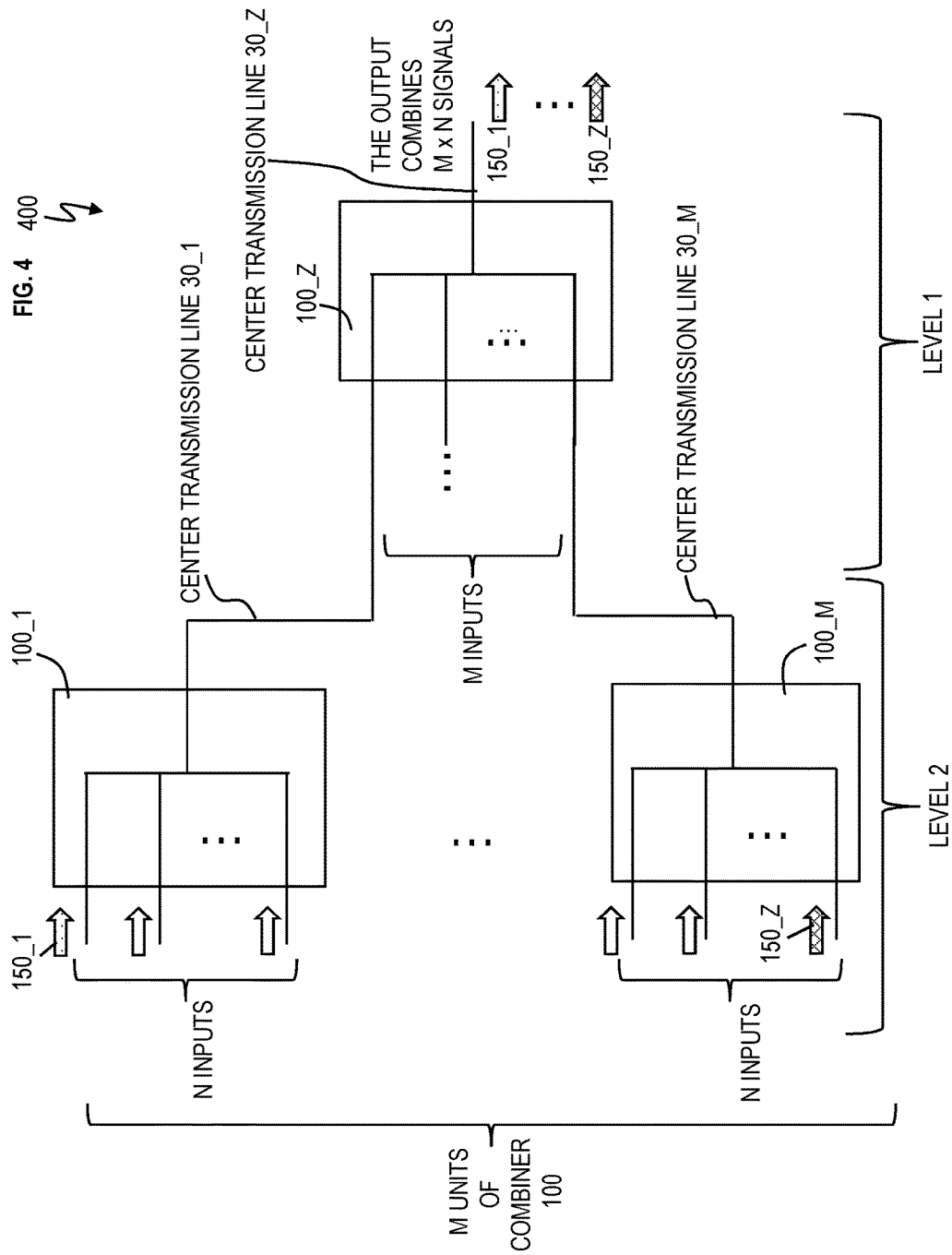
FIG. 4 illustrates devices as a cascading tree of power combiners according to one or more embodiments.

FIG. 4 illustrates devices 100 as a cascading tree of power combiners according to one or more embodiments. FIG. 4 is an example of scaling up the devices 100. The devices 100 are configured to be fabricated on a wafer, for example, as a chip. So as not to unnecessarily obscure the FIG. 4, some details of the devices 100 have been omitted for the sake of clarity. It is understood that these details are included by analogy as discussed herein.

In this example, the tree of power combiners is depicted with 2 levels. In other implementations, there can be 3, 4, 5 . . . 10 or more levels in the tree of power combiners. In FIG. 4, there can be M units of the devices 100 in level 2, and the M units of devices 100 each have N inputs in level 2. Having N inputs means that each device 100 in level 2 has the corresponding number of N ports 110 connected to their respective one of the N bandpass filters 105. As discussed herein, each of the N inputs has a single port 110 and single bandpass filter 105 on a one-to-one basis. In level 2, the devices 100 have bandpass filters 105 in which each of the bandpass filters 105 has a different passband (i.e., a different frequency band) as discussed herein, such that there is no overlap in their coverage of frequencies.

Each of the power combiner devices 100_1 through 100_M is configured to output microwave signals 150 on its respective center transmission line 30_1 through 30_M. The designation of transmission line 30_1 through 30_M is utilized to show that each one of the power combiner devices 100_1 through 100_M has its own output transmission line 30, and accordingly, the total number of center transmission lines 30 from the devices 100 in level 2 is equal to M. In level 1, the device 100_Z has M number of inputs. The output of each device 100_1 through 100_M is individually connected to its own one of the M number of inputs of the device 100_Z, such that each of the center transmission lines 30_1 through 30_M is one of the M inputs of the device 100_Z.

The device 100_Z is identical to the devices 100 discussed herein. However, the device 100_Z is structured such that each of the M inputs has its own connected bandpass filter 105 in level 1 with a passband that covers all of the passbands of the bandpass filters 105 in the lower level 2 per center transmission line 30. For example, in level 1 of the tree 400, device 100_Z has a first input (of the M inputs) with port 1 so that its bandpass filter 105 in level 1 includes all of the passbands of the bandpass filters in the device 100_1 in the level 2. Similarly, in level 1 of the tree 400, device 100_Z has a second input (of the M inputs) with port 2 so that its bandpass filter 105 in level 1 includes all of the passbands of the bandpass filters in the device 100_2 (not shown) in the level 2. Through the last input (of the M inputs) in level 1 of the tree 400, device 100_Z has a last input with port N so that its bandpass filter 105 in level 1 includes all of the passbands of the bandpass filters in the device 100_M in the level 2.

In level 1, the device 100_Z is configured to receive the microwave signal 150_1 through 150_Z on the M inputs and combine the microwave signals 150_1 through 150_Z to be output on the center transmission line 30_Z. Accordingly, the tree 400 of power devices is scaled up such that the level 1 device 100_Z outputs M×N microwave signals 150 which correspond to M units of the devices 100 in level 2 each of the devices 100 in level 2 having N inputs. The direction of the microwave signals 150_1 through 150_Z shows the tree 400 operating as a scaled-up power combiner. Analogously, the direction of the microwave signals 150_1 through 150_Z can be switched to operate as a scaled-up signal distributer.

Figure 5:
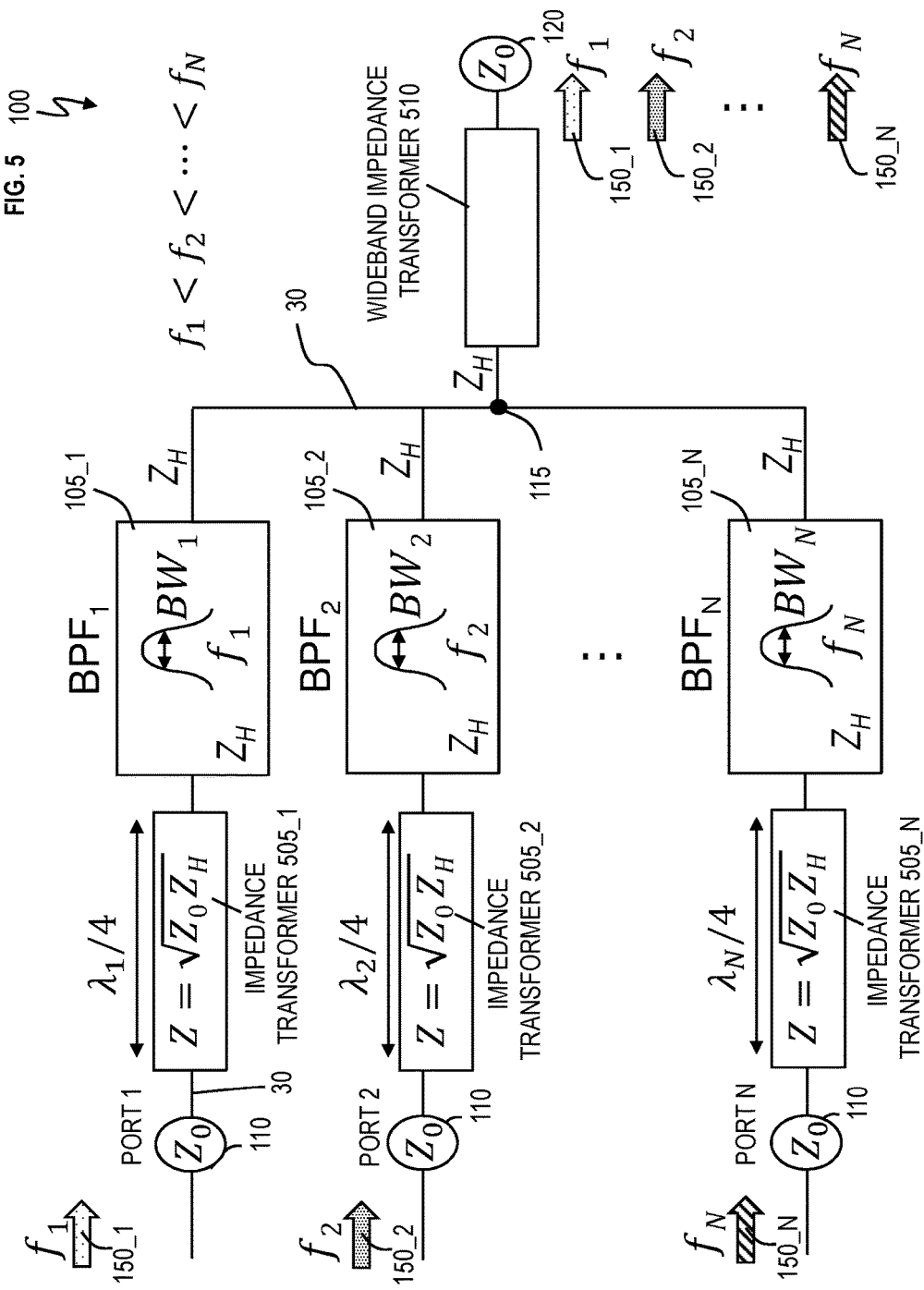
FIG. 5 is a schematic of the device depicting a microwave combiner for quantum signals according to one or more embodiments.

FIG. 5 is a schematic of the device 100 depicting a microwave combiner for quantum signals according to one or more embodiments. The device 100 includes all the various features discussed herein. Further, the device 100 includes additional features to ensure impedance matching for the passing microwave signals (i.e., minimize reflections along the signal path), and also enable the connection of multiple branches/lines to the common node 115.

In FIG. 5, impedance transformers 505_1 through 505_N are respectively added between the respective ports 1 through N and their associated bandpass filters 105_1 through 105_N. Also, the device 100 includes a wideband impedance transformer 510 connected to the common node 115 and the common port 120. The impedance transformers 505_1 through 505_N and impedance transformer 510 are configured to provide impedance matching. On one end of the device 100, the impedance transformers 505_1 through 505_N are structured to match (or nearly match) the input impedance $Z_0$ of the ports 1-N and to match the associated bandpass filter 105_1 through 105_N. Each of the impedance transformers 505_1 through 505_N is configured with a characteristic impedance $Z=\sqrt{Z_0 Z_H}$, where $Z_0$ is the input impedance (as well as the output impedance), where $Z_H$ is the high impedance of the bandpass filters 105_1 through 105_N, and where $Z$ is the average impedance of each impedance transformers 505_1 through 505_N. The average characteristic impedance $Z$ is the square root of the product of $Z_0$ and $Z_H$. One reason why transforming the impedance of the device ports $Z_0$ to high characteristic impedance $Z_H$ in the region of the common node can be useful, is because, in general, high impedance transmission lines, such as a microstip or stripline, have narrow traces which in turn minimize the physical size of the common node and allows more lines to be joined together at that node. This is particularly relevant if the bandpass filters are implemented as coupled-line filters and/or capacitively-coupled resonators. If, however, all filters are implemented using lumped-elements (with a very small footprint), such impedance transformations might be less of a concern.

In one implementation, the impedance transformers 505_1 through 505_N can be impedance matching transmission lines where one end (e.g., left end) has a wide width matching the input impedance $Z_0$ and the opposite end (e.g., right end) has a narrow width matching the high impedance $Z_H$ of the bandpass filters 105. Each of the impedance matching transformers 505_1 through 505_N has a length according to its own respective relationship $\lambda_1/4$, $\lambda_2/4$, ..., $\lambda_N/4$, where $\lambda_1$ is the wavelength of the microwave signal 150_1, where $\lambda_2$ is wavelength of the microwave signal 150_2, through $\lambda_N$ which is the wavelength of the microwave signal 150_N. These impedance transformers have in general narrow bandwidths.

In one implementation, the wideband impedance transformer 510 can be an impedance matching transmission line where one end (e.g., left end) has a narrow width matching the high impedance $Z_H$ of the bandpass filters 105 (via common node 115) while the opposite end (e.g., right end) has a wide width matching the output impedance $Z_0$. Such a wideband impedance transformer can be implemented using tapered transmission lines, for example, transmission lines whose widths are changed adiabatically on the scale of the maximum signal wavelength. Other implementations of tapered lines known to one skilled in the art are possible as well, such as the Exponential Taper or the Klopfenstein Taper. Also, it should be noted that the wideband requirement for this impedance transformer versus the other transformers 505, arises from the fact that this wideband transformer needs to match the characteristic impedance for a wideband of signal frequencies transmitted through it, in contrast to the impedance transformers 505 which need only to match the impedance for a narrow frequency range centered around the corresponding center frequency of the bandpass.

The impedance transformers 505_1 through 505_N and impedance transformer 510 are made of superconducting material as discussed herein, such as, for example, niobium, aluminum, tantalum, etc.

The impedance designation $Z_0$ is the characteristic impedance at ports 110 and 120 (which can be the input and output ports or vice versa). For example, the characteristic impedance $Z_0$ can be 50 ohms (Ω) at each port 110 and 120 as recognized by one skilled in the art.

Figure 6:
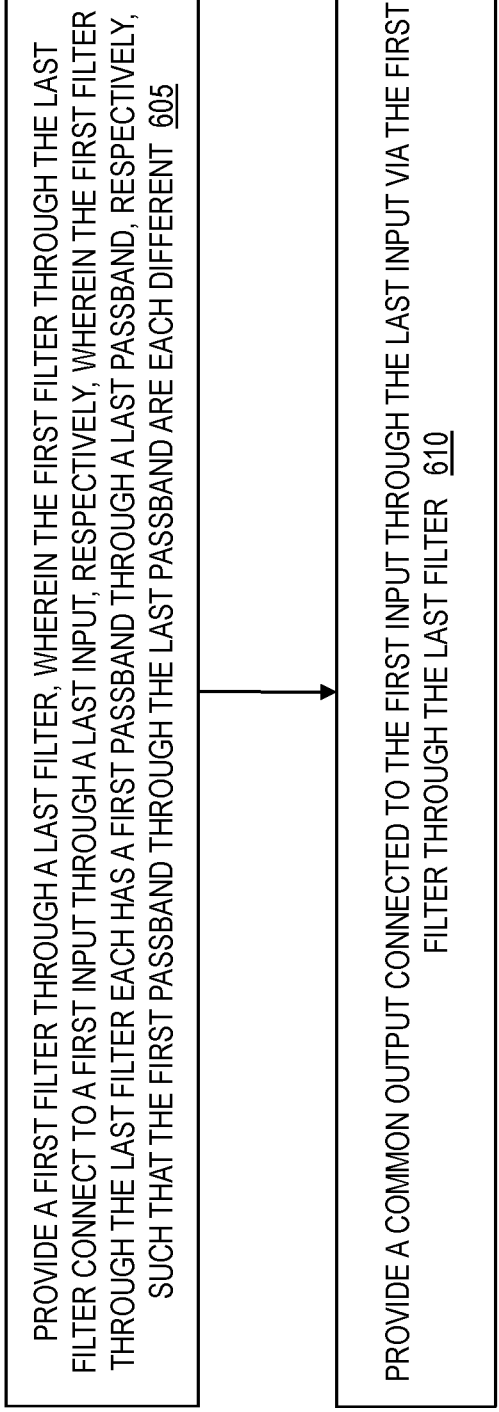
FIG. 6 is a flow chart of a method of configuring a superconducting microwave combiner device according to one or more embodiments.

FIG. 6 is a flow chart of a method 600 of configuring a superconducting microwave combiner device 100 according to one or more embodiments. Reference can be made to FIGS. 1-5.

At block 605, a first filter 105_1 through a last filter is provided. The first filter 105_1 through the last filter 105_N connect to a first input through a last input (e.g., transmission line 30 individually connected to respective ports 110), respectively. The first filter 105_1 through the last filter 105_N each has a first passband through a last passband (respectively including frequencies $f_1$-$f_N$), respectively, such that the first passband through the last passband are each different.

At block 610, a common output (e.g., transmission line 30 connected to common port 120) connected to the first input through the last input via the first filter 105_1 through the last filter 105_1.

The first input through the last input are each isolated from one another, thereby avoiding signal leakage among the first input through the last input. The first filter through the last filter are each configured to transmit signals (e.g., microwave signals 150_1-150_N) at a different set of frequencies. The first filter through the last filter (e.g., bandpass filters 105_1-105_N) are each passive thereby requiring no operational power to operate as passive filters, and requiring no power gain.

The first filter 105_1 of the first filter through the last filter is configured to only pass the signals at a first set of frequencies, the next filter 105_2, of the first filter through the last filter is configured to only pass the signals at a next set of frequencies, and the last filter 105_N of the first filter through the last filter is configured to only pass the signals at a last set of frequencies. Each of the first set, next set, and last set of frequencies are non-overlapping (i.e., the passbands do not overlap).

The first input through the last input include a first port (e.g., port 1) through a last port (e.g., port N), respectively. The first port 1 through the last port N are operatively connected to the first filter 105_1 through the last filter 105_N, respectively, such that a first through last signals (e.g., microwave signals 150_1-150_N or microwave signals 150_1-150_Z in FIG. 4) respectively input through the first port through the last port are to be combined and output through a common port 120.

A first impedance transformer 505_1 through a last impedance transformer 505_N are respectively connected in between the first port 1 through the last port N and the first filter 105_1 through the last filter 105_N. The first impedance transformer through the last impedance transformer are configured to provide impedance matching as discussed in FIG. 5. A common impedance transformer 510 is connected between the first filter 105_1 through the last filter 105_N and the common port 120, and the common impedance transformer 510 is configured to provide impedance matching. The first filter through the last filter are superconducting, and the first filter through the last filter including superconducting materials.

Figure 7:
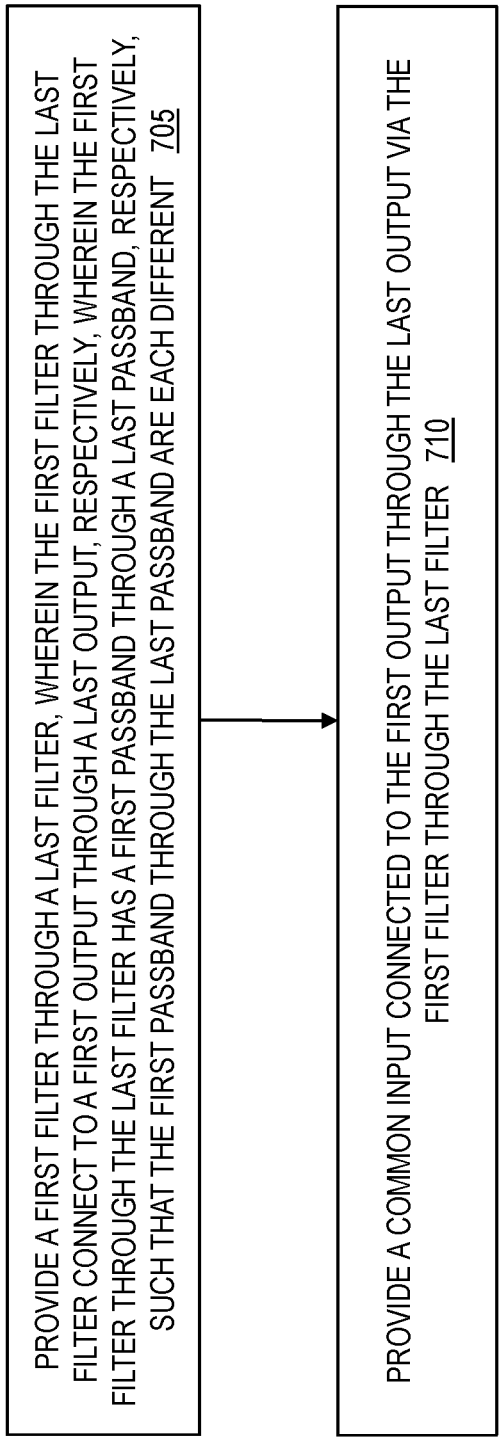
FIG. 7 is a flow chart of a method of configuring a superconducting microwave distributer device according to one or more embodiments.

FIG. 7 is a flow chart of a method 700 of configuring a superconducting microwave distributer device 100 according to one or more embodiments. Reference can be made to FIGS. 1-6. The superconducting microwave distributer and the superconducting microwave combiner are the same device. However, the microwave distributer and combiner operate in opposite directions as discussed. Particularly, the input ports and output ports are utilized in reverse order with respect to input and output microwave signals 150.

At block 705, a first filter through a last filter is provided. The first filter 105_1 through the last filter 105_N connect to a first output through a last output (e.g., transmission line 30 individually connected to respective ports 110), respectively. The first filter 105_1 through the last filter 105_N has a first passband through a last passband (respectively including frequencies $f_1$-$f_N$), respectively, such that the first passband through the last passband are each different.

At block 710, a common input (e.g., transmission line 30 connected to common port 120) is connected to the first output through the last output via the first filter 105_1 through the last filter 105_N.

The first output through the last output are each isolated from one another, thereby avoiding signal leakage among the first output through the last output. The first filter through the last filter are each configured to transmit signals (e.g., microwave signals 150_1-150_N) at a different set of frequencies. The first filter through the last filter (e.g., bandpass filters 105_1-105_N) are each passive thereby requiring no operational power to operate as passive filters, and generating no power gain.

The first filter 105_1 of the first filter through the last filter is configured to only pass the signals at a first set of frequencies, the next filter 105_2, of the first filter through the last filter is configured to only pass the signals at a next set of frequencies, and the last filter 105_N of the first filter through the last filter is configured to only pass the signals at a last set of frequencies. Each of the first set, next set, and last set of frequencies are non-overlapping (i.e., the passbands do not overlap).

The first output through the last output include a first port (e.g., port 1) through a last port (e.g., port N), respectively. The first port 1 through the last port N are operatively connected to the first filter 105_1 through the last filter 105_N, respectively, such that a first through last signals (e.g., microwave signals 150_1-150_N or microwave signals 150_1-150_Z in FIG. 4) respectively output through the first port through the last port. The first through last signals (e.g., microwave signals 150_1-150_N or microwave signals 150_1-150_Z in FIG. 4) are together input through a common port 120 at different frequencies.

A first impedance transformer 505_1 through a last impedance transformer 505_N are respectively connected in between the first port 1 through the last port N and the first filter 105_1 through the last filter 105_N. The first impedance transformer through the last impedance transformer are configured to provide impedance matching as discussed in FIG. 5. A common impedance transformer 510 is connected between the first filter 105_1 through the last filter 105_N and the common port 120, and the common impedance transformer 510 is configured to provide wideband impedance matching. The first filter through the last filter are superconducting, and the first filter through the last filter include superconducting materials.

One or more embodiments include a superconducting system 300. A first filter 105_1 through the last filter 105_N is configured to connect to the first quantum system 305_1 through the last quantum system 305_N, respectively. The first filter through the last filter has a first passband through a last passband (respectively including frequencies $f_1$-$f_N$), respectively, such that the first passband through the last passband are each different. A common output (e.g., transmission line 30 connected to common port 120) is connected to the first quantum system 305_1 through the last quantum system 305_N via the first filter 105_1 through the last filter 105_N.

The first quantum system 305_1 through the last quantum system 305_N are configured to resonate at a first resonance frequency (e.g., frequency $f_1$) through a last resonance frequency ($f_N$). The first filter through the last filter are configured to operate in transmission (pass/transmit the signal) for the first resonance frequency through the last resonance frequency respectively, such that each of the first filter through the last filter is associated with (only) one of the first resonance frequency $f_1$ through the last resonance frequency $f_N$.

The first filter through the last filter are configured to operate in reflection (i.e., to block) for any other ones of the first resonance frequency through the last resonance frequency except the associated one of the first resonance frequency through the last resonance frequency. In other words, the frequencies $f_1$-$f_N$ are selected to match/overlap its own one of the quantum system 305_1-305_N resonance frequency on a one-to-one basis.

Technical effects and benefits include techniques and devices which separate the microwave signals based on their frequency thereby allowing the device to multiplex the readout and drive of multiple qubits without attenuating the microwave signals used in the drive and/or readout. Technical benefits further include isolation between the different ports in a power combiner and signal distributor.

The term "about" and variations thereof are intended to include the degree of error associated with measurement of the particular quantity based upon the equipment available at the time of filing the application. For example, "about" can include a range of ±8% or 5%, or 2% of a given value.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A superconducting microwave combiner comprising:
   a first filter through a last filter, wherein the first filter through the last filter connect to a first input through a last input, respectively, wherein the first filter through the last filter each has a first passband through a last passband, respectively, such that the first passband through the last passband are each different, wherein the first input through the last input do not connect to one another;
   a common output connected to the first input through the last input via the first filter through the last filter, wherein the first filter through the last filter are superconducting, the first filter through the last filter including superconducting lumped elements;
   wherein the first input through the last input include a first port through a last port, respectively, such that the first port through the last port are operatively connected to the first filter through the last filter, respectively;
   wherein a first impedance transformer through a last impedance transformer are respectively connected in between the first port through the last port and the first filter through the last filter, such that one end of the first impedance transformer is connected to the first port and another end of the first impedance transformer is connected to the first filter;
   a common impedance transformer connected between the first filter through the last filter and the common port, the common impedance transformer being configured to provide impedance matching, the common impedance transformer being directly coupled to the first filter through the last filter;
   wherein the common impedance transformer is a single two pole element having two connection points within the superconducting microwave combiner.

2. The superconducting microwave combiner of claim 1, wherein the first input through the last input are each isolated from one another, thereby avoiding signal leakage among the first input through the last input.

3. The superconducting microwave combiner of claim 1, wherein the first filter through the last filter are each configured to transmit signals at a different set of frequencies; and
   wherein the first filter through the last filter are each passive thereby requiring no operational power to operate as passive filters.

4. The superconducting microwave combiner of claim 3, wherein:
   the first filter of the first filter through the last filter is configured to only pass the signals at a first set of frequencies,
   a next filter of the first filter through the last filter is configured to only pass the signals at a next set of frequencies, and
   the last filter of the first filter through the last filter is configured to only pass the signals at a last set of frequencies, each of the first set, the next set, and the last set of frequencies being non-overlapping.

5. The superconducting microwave combiner of claim 1, wherein the first port through the last port are operatively connected to the first filter through the last filter, respectively, such that a first through last signals respectively input through the first port through the last port are to be combined and output through a common port.

6. The superconducting microwave combiner of claim 1, wherein the first impedance transformer through the last impedance transformer are configured to provide impedance matching.

7. The superconducting microwave combiner of claim 1, wherein the first filter through the last filter comprise superconducting materials.

8. A method of configuring a superconducting microwave combiner, the method comprising:
providing a first filter through a last filter, wherein the first filter through the last filter connect to a first input through a last input, respectively, wherein the first filter through the last filter each has a first passband through a last passband, respectively, such that the first passband through the last passband are each different, wherein the first input through the last input do not connect to one another; and
providing a common output connected to the first input through the last input via the first filter through the last filter, wherein the first filter through the last filter are superconducting, the first filter through the last filter including superconducting lumped elements;
wherein the first input through the last input include a first port through a last port, respectively, such that the first port through the last port are operatively connected to the first filter through the last filter, respectively;
wherein a first impedance transformer through a last impedance transformer are respectively connected in between the first port through the last port and the first filter through the last filter, such that one end of the first impedance transformer is connected to the first port and another end of the first impedance transformer is connected to the first filter;
connecting a common impedance transformer between the first filter through the last filter and the common port, the common impedance transformer being configured to provide impedance matching, the common impedance transformer being directly coupled to the first filter through the last filter;
wherein the common impedance transformer is a single two pole element having two connection points within the superconducting microwave combiner.

9. The method of claim 8, wherein the first input through the last input are each isolated from one another, thereby avoiding signal leakage among the first input through the last input.

10. The method of claim 8, wherein the first filter through the last filter are each configured to transmit signals at a different set of frequencies; and
wherein the first filter through the last filter are each passive thereby requiring no operational power to operate as passive filters.

11. The method of claim 10, wherein:
the first filter of the first filter through the last filter is configured to only pass the signals at a first set of frequencies,
a next filter of the first filter through the last filter is configured to only pass the signals at a next set of frequencies, and
the last filter of the first filter through the last filter is configured to only pass the signals at a last set of frequencies, each of the first set, the next set, and the last set of frequencies being non-overlapping.

12. The method of claim 8, wherein the first port through the last port are operatively connected to the first filter through the last filter, respectively, such that a first through last signals respectively input through the first port through the last port are to be combined and output through a common port.

13. The method of claim 8, wherein the first filter through the last filter includes superconducting materials.

14. A superconducting microwave distributer comprising:
a first filter through a last filter, wherein the first filter through the last filter connect to a first output through a last output, respectively, wherein the first filter through the last filter has a first passband through a last passband, respectively, such that the first passband through the last passband are each different;
a common input connected to the first output through the last output via the first filter through the last filter, wherein the first filter through the last filter are superconducting, the first filter through the last filter including superconducting lumped elements;
wherein the first input through the last input include a first port through a last port, respectively, such that the first port through the last port are operatively connected to the first filter through the last filter, respectively;
wherein a first impedance transformer through a last impedance transformer are respectively connected in between the first port through the last port and the first filter through the last filter, such that one end of the first impedance transformer is connected to the first port and another end of the first impedance transformer is connected to the first filter; and
a common impedance transformer connected between the first filter through the last filter and the common port, the common impedance transformer being configured to provide impedance matching, the common impedance transformer being directly coupled to the first filter through the last filter;
wherein the common impedance transformer is a single two pole element having two connection points within the superconducting microwave combiner.

15. The superconducting microwave distributer of claim 14, wherein the first output through the last output are each isolated from one another, thereby avoiding signal leakage among the first output through the last output.

16. The superconducting microwave distributer of claim 14, wherein the first filter through the last filter are each configured to transmit signals at a different set of frequencies; and
wherein the first filter through the last filter are each passive thereby requiring no operational power to operate as passive filters.

17. The superconducting microwave distributer of claim 16, wherein:
the first filter of the first filter through the last filter is configured to only pass the signals at a first set of frequencies,
a next filter of the first filter through the last filter is configured to only pass the signals at a next set of frequencies, and
the last filter of the first filter through the last filter is configured to only pass the signals at a last set of frequencies, each of the first set, the next set, and the last set of frequencies being non-overlapping.

18. The superconducting microwave distributer of claim 14, wherein the first port through the last port are operatively connected to the first filter through the last filter, respectively, such that a first through last signals respectively output through the first port through the last port, the first through last signals being input through a common port.

19. The superconducting microwave distributer of claim 14, wherein the first filter through the last filter includes superconducting materials.

20. A method of configuring a superconducting microwave distributer, the method comprising:
providing a first filter through a last filter, wherein the first filter through the last filter connect to a first output through a last output, respectively, wherein the first filter through the last filter has a first passband through a last passband, respectively, such that the first passband through the last passband are each different, wherein the first output through the last output do not connect to one another; and
providing a common input connected to the first output through the last output via the first filter through the last filter, wherein the first filter through the last filter are superconducting, the first filter through the last filter including superconducting lumped elements;
wherein the first input through the last input include a first port through a last port, respectively, such that the first port through the last port are operatively connected to the first filter through the last filter, respectively;
wherein a first impedance transformer through a last impedance transformer are respectively connected in between the first port through the last port and the first filter through the last filter, such that one end of the first impedance transformer is connected to the first port and another end of the first impedance transformer is connected to the first filter;
connecting a common impedance transformer between the first filter through the last filter and the common port, the common impedance transformer being configured to provide impedance matching, the common impedance transformer being directly coupled to the first filter through the last filter;
wherein the common impedance transformer is a single two pole element having two connection points within the superconducting microwave combiner.

21. The method of claim 20, wherein the first output through the last output are each isolated from one another, thereby avoiding signal leakage among the first output through the last output.

22. The method of claim 20, wherein the first filter through the last filter are each configured to transmit signals at a different set of frequencies; and
wherein the first filter through the last filter are each passive thereby requiring no operational power to operate as passive filters.

23. The method of claim 22, wherein:
the first filter of the first filter through the last filter is configured to only pass the signals at a first set of frequencies,
a next filter of the first filter through the last filter is configured to only pass the signals at a next set of frequencies, and
the last filter of the first filter through the last filter is configured to only pass the signals at a last set of frequencies, each of the first set, the next set, and the last set of frequencies being non-overlapping.

* * * * *